(12) United States Patent
Mathur et al.

(10) Patent No.: US 9,186,562 B1
(45) Date of Patent: Nov. 17, 2015

(54) SPORTS GEAR ACHIEVING SPECIFIED PERFORMANCE CRITERIA AND THE CORRESPONDING METHODS OF MAKING

(71) Applicants: Raj Narain Mathur, Goodview, MN (US); Stephen T. Bowen, LaCrescent, MN (US)

(72) Inventors: Raj Narain Mathur, Goodview, MN (US); Stephen T. Bowen, LaCrescent, MN (US)

(73) Assignee: Plasticomp, Inc., Winona, MN (US)

( * ) Notice: Subject to any disclaimer, the term of this patent is extended or adjusted under 35 U.S.C. 154(b) by 204 days.

(21) Appl. No.: 13/749,050

(22) Filed: Jan. 24, 2013

Related U.S. Application Data

(60) Provisional application No. 61/590,220, filed on Jan. 24, 2012.

(51) Int. Cl.
*A63B 59/00* (2015.01)
*A63B 59/06* (2006.01)
*G06F 17/50* (2006.01)

(52) U.S. Cl.
CPC ............ *A63B 59/06* (2013.01); *G06F 17/5018* (2013.01)

(58) Field of Classification Search
USPC .......................... 473/564, 513, 565, 566, 567
See application file for complete search history.

(56) References Cited

U.S. PATENT DOCUMENTS

| | | | |
|---|---|---|---|
| 3,830,496 A | 8/1974 | Reizer | |
| 4,092,025 A | 5/1978 | Yanagioka | |
| 4,541,629 A | 9/1985 | Witkowski | |
| 5,301,940 A | 4/1994 | Seki et al. | |
| 5,303,917 A | 4/1994 | Uke | |
| 5,820,438 A * | 10/1998 | Horton, III | 446/213 |
| 6,010,435 A * | 1/2000 | Tanabe | 482/83 |
| 6,634,969 B2 | 10/2003 | Forsythe et al. | |
| 6,729,983 B1 * | 5/2004 | Vakili et al. | 473/566 |
| 7,575,527 B2 | 8/2009 | Davis et al. | |
| 7,651,420 B1 | 1/2010 | Gaff et al. | |
| 7,850,554 B2 * | 12/2010 | Burger | 473/567 |
| 2002/0198071 A1 * | 12/2002 | Snow | 473/564 |
| 2004/0198539 A1 | 10/2004 | Sutherland et al. | |
| 2006/0111206 A1 * | 5/2006 | Adams et al. | 473/513 |
| 2007/0132140 A1 * | 6/2007 | Wu | 264/257 |
| 2007/0202974 A1 * | 8/2007 | Giannetti | 473/564 |
| 2007/0207882 A1 * | 9/2007 | Van Nguyen | 473/564 |
| 2008/0058132 A1 * | 3/2008 | Nguyen | 473/564 |
| 2008/0287228 A1 | 11/2008 | Giannetti | |
| 2009/0011877 A1 | 1/2009 | Iwata et al. | |
| 2009/0163307 A1 | 6/2009 | Fujii et al. | |
| 2009/0264230 A1 * | 10/2009 | Thouin | 473/567 |
| 2009/0280935 A1 * | 11/2009 | Watari et al. | 473/566 |
| 2010/0113194 A1 | 5/2010 | Tokieda | |
| 2011/0172038 A1 * | 7/2011 | Watari et al. | 473/564 |
| 2012/0184402 A1 * | 7/2012 | McNamee et al. | 473/520 |

OTHER PUBLICATIONS

Webpage download, Russel2009, 2009, bmsi.ru/doc/1308dd4e-2aba-4d8b-854e-c69f511c93b9/print, 3 pages.*

(Continued)

*Primary Examiner* — Gene Kim
*Assistant Examiner* — M Chambers
(74) *Attorney, Agent, or Firm* — Brannen Law Office, LLC

(57) ABSTRACT

The present invention relates to sports gear and in particular to sports gear that is capable of being manufactured to achieve specific performance criteria. As an example, a baseball bat is described herein. However, other sports gear where "bat-ball" type of collision is expected is also within the scope of the present invention. The sports gear can be made of a long thin-walled structure. The wall itself has long discontinuous fibers. A three dimensional (3D) structure is therefore provided. The sports gear is designed to achieve specified performance criteria.

11 Claims, 8 Drawing Sheets

(56) References Cited

OTHER PUBLICATIONS

Webpage download, Softballbats2013, 2013, softballbats.weebly.com/what-is-carbon-fiber.html, 3 pages.*

Webpage download, Youtube2010, 2010, www.youtube.com/watch?v=XzSxaY4nOls, 10 pages.*

Webpage download, Correllation2004, Russel, 2004, www.slideserve.com/zandra/correlation-between-bat-performance-and-hoop-frequency, 14 pages.*

* cited by examiner 30A   80   40A

Modal Characteristics of C353 Profile with Constant Wall Thickness of 0.25 in.

| Material | First Bending Mode (Hz) | First Hoop Mode (Hz) |
|---|---|---|
| Target | 80-220 | ~3000 |
| LCF Low + TPU (Type A) | 167 | 2554 |
| LGF Medium + PA66 | 130 | 1992 |
| LCF Low + TPU (Type B) | 107 | 1731 |
| LCF Low + TPU (Type C) | 155 | 2418 |

Minimum Wall Thickness to withstand 166-mph Impact

| Material | Wall Thickness (in) |
|---|---|
| LCF Low + TPU (TYPE A) | 0.28 |
| LGF Medium + PA66 | 0.32 |
| LCF Low + TPU (Type B) | 0.42 |
| LCF Low + TPU (Type C) | 0.30 |

FIG. 11

SPORTS GEAR ACHIEVING SPECIFIED PERFORMANCE CRITERIA AND THE CORRESPONDING METHODS OF MAKING

This United States utility patent application claims priority on and the benefit of provisional application 61/590,220 filed Jan. 24, 2012, the entire contents of which are hereby incorporated herein by reference.

BACKGROUND OF THE INVENTION

1. Field of the Invention

The present invention relates to sports gear and in particular to sports gear that is capable of being manufactured to achieve specific performance criteria. The concepts of the present invention can be used for situations where "bat-ball" collisions are expected. For example, tennis rackets, baseball bats, hockey sticks and cricket bats may all benefit from the concepts of the present invention.

2. Description of the Related Art

Traditionally, sports gear of the above-type has been made of wood and/or metal. Some composite materials have also been used. For example:

United States Published Application 20090011877 to Iwata et al. is titled Bat for Baseball or Softball. It illustrates a bat having a core member with a depression at a portion to be a ball-hitting portion, and an elastic body attached to the depression and forming the ball-hitting portion. The elastic body is formed of urethane elastomeric foam having specific gravity of at least 0.45 and at most 0.60, JIS C hardness of at least 54 and at most 82, and modulus of elasticity in 300% elongation of at least 3.85 MPa and at most 5.6 MPa.

United States Published Application 20080287228 to Giannetti is titled Single Wall Ball Bat Including E-Glass Structural Fiber. The Giannetti application shows a single-wall ball bat with a series of layers or plies of unidirectional, two-dimensional, structural fibers. The plies are optionally layered upon each other in a lamina structure in which the fibers in one ply are oriented at opposing angles to the fibers in one or more neighboring plies. Low tensile modulus, two-dimensional E-glass fibers, oriented to provide desired durability, may be used to construct a substantial portion of the barrel or other regions of the ball bat.

United States Published Application 20040198539 to Sutherland et al. is titled Polymer Composite Bat. The Sutherland application describes a bat having of an elongated cylindrical handle portion for gripping, a cylindrical barrel portion for striking and a tapered cylindrical mid-section connecting the handle portion and the barrel portion, wherein at least the barrel portion is tubular and is constructed solely of a polymer composite material with a three-dimensional fiber reinforcement architecture Also disclosed are polymer composite baseball bats where the polymer composite material includes between 85% and 100% fiberglass reinforcement fibers, and/or where the central cavity is filled with a damping material such as polymeric foam or a low-density granular material, and/or where the bats are constructed of multiple layers of intertwined tubular braid forms using a precision molding process.

U.S. Pat. No. 7,575,527 to Davis et al. is titled Composite Bat Having a Single, Hollow Primary Tube Structure. It illustrates a bat formed of a single, hollow tube of composite material, wherein tubular "ports" extend through the hollow tube. The ends of the ports are bonded to the walls of the hollow tube. The ports improve the stiffness, strength, aerodynamics and comfort of the bat. In column 4, lines 34+ it is described how the tube is made of long fiber reinforced prepreg type material.

U.S. Pat. No. 6,634,969 to Forsythe et al. is titled Method of Tuning a Bat and a Tuned Bat. It teaches a method of tuning a bat that includes estimating a ball-bat interaction time, Ti, of an impact between a ball and the bat and tuning at least one desired mode of vibration in the bat produced by the impact. The desired mode of vibration is tuned by selecting properties of the bat so that the desired mode of vibration has a period approximately equal to 4/3 Ti. When a mode of vibration is so tuned, the energy the vibration transfers to a batted ball is optimized. A tuned bat has one or more of the desired modes that is approximately equal to 4/3 Ti, giving the bat a desirable bat performance factor and a desirable level of durability. Typically, the first hoop mode of vibration is given first priority during tuning of the bat. However, other modes of vibration, such as an axial bending mode of vibration may also be tuned to have a period approximately equal to 4/3 Ti. This is particularly true in composite bats where selecting the fiber angles can yield a different modulus of elasticity, for example, in the hoop direction than in the direction of the longitudinal axis of the bat, thereby tuning a hoop mode of vibration and an axial bending mode of vibration.

While the preceding published applications and patents may describe products that work well for their intended purposes, none teach the unique aspects of the present invention.

Two dimensional ("2D") structures or laminates of fibers in thermoset polymeric matrices tend to be labor intensive and have high variability in performance. Shifts in material behavior in use can lead to difficulty in achieving a specific performance, difficulty in monitoring specifications and can be prone to tampering in an attempt to increase performance. Given the lack of performance measurements, the sports equipment made of these 2D methods tend to be quantified by feel or vibrational characteristics as opposed to more objective criteria. Further, inherent in a 2D structure is the lack of fibers oriented in a third dimension.

None of the preceding published applications or patents shows sports equipment with long discontinuous fibers in a long thin walled structure, or Long Fiber Thermoplastics (LFT).

One problem with sports equipment is termed a trampoline effect. In essence, the trampoline effect is caused by oscillations of the hollow cylindrical barrel of metal and composite bats. None of the preceding published applications or patents shows sports equipment designed to eliminate a trampoline effect. Laminated or layered bat structures often hide internal cracks that develop with time and that lead to softening and the trampoline effect. Quite often, laminated bats can initially pass the BBCOR (Ball Bat Coefficient of Restitution) test, but often flout this specification with bat use.

None of the preceding published applications or patents shows a method of making sports equipment designed to achieve selected objective performance characteristics.

A further disadvantage of using a two-dimensional hand-layup method of manufacture is the inconsistency and imprecision apparent in the manufactured product.

Bat rolling is a procedure that some can use to increase the trampoline effect of traditional thermoset/fiber laminates. This process is undesirable as it allows the user's to manipulate the bat in an unintended way.

Thus there exists a need for sports gear that solves these and other problems.

SUMMARY OF THE INVENTION

The present invention relates to sports gear and in particular to sports gear that is capable of being manufactured to achieve specific performance criteria. As an example, a baseball bat is described herein. However, other sports gear where "bat-ball" type of collision is expected is also within the scope of the present invention. The sports gear can be made of a long thin-walled structure. The wall itself has long discontinuous fibers. A three dimensional (3D) structure is therefore provided. The sports gear is designed to achieve specified performance criteria.

The 3D structure advantageously leads to measurable, tailorable and quantifiable definitions of performance.

The material properties, such as stiffness, loss and storage moduli, can be manipulated. Resonant frequencies instead of "feel" can be used to drive the design of the sports gear of the present invention.

Knowing the material hardness and ball velocity, the designer can select proper fiber types and content to achieve a desirable completed piece of equipment.

According to a still further advantage of the present invention, the sports equipment can have varied material construction. For example, the barrel (or ball hit/strike portion) can have one type of construction, and the handle can have a different type of construction. Advantageously, this allows each component to be designed for a specific purpose. Also, by using different materials for each section that are specifically designed for their intended purposes, sports equipment that is highly responsive to meet intended criteria can be produced.

According to a still further advantage yet of the present invention, a computer can be used to help design sports equipment with desirable profiles and durability criteria.

According to a still further advantage yet of the present invention, the end product is made from a consistent and repeatable process yielding predictable results.

According to a still further advantage of the present invention, the handle and barrel sections can be made with different properties and joined to form equipment with strong joints and desirable properties.

According to another advantage of the present invention, a single molded barrel and handle can be used to make bats of other lengths by sawing off or otherwise removing appropriate lengths of the barrel and handle lengths without sacrificing the bat profile. Injection moldability is therefore increased, as a single mold can be used to produce parts having different lengths. Tool costs are also minimized.

According to a still further advantage of the present invention, the use of Long Fiber Thermoplastics (LFT) leads to an absence of material yield or delamination. Accordingly, the trampoline effect is minimized.

According to a still further advantage of the present invention, the ability of a user to engage in bat rolling is eliminated. This is because the bat will cleanly break rather than endure multiple cracking events. Stated another way, the bat of the present invention exhibits minimal plastic deformation prior to failure.

Other advantages, benefits, and features of the present invention will become apparent to those skilled in the art upon reading the detailed description of the invention and studying the drawings.

BRIEF DESCRIPTION OF THE DRAWINGS

FIG. 11 is a table showing minimum wall thickness to withstand 166 mpg impact.

DETAILED DESCRIPTION OF PREFERRED EMBODIMENTS

Figure 1:
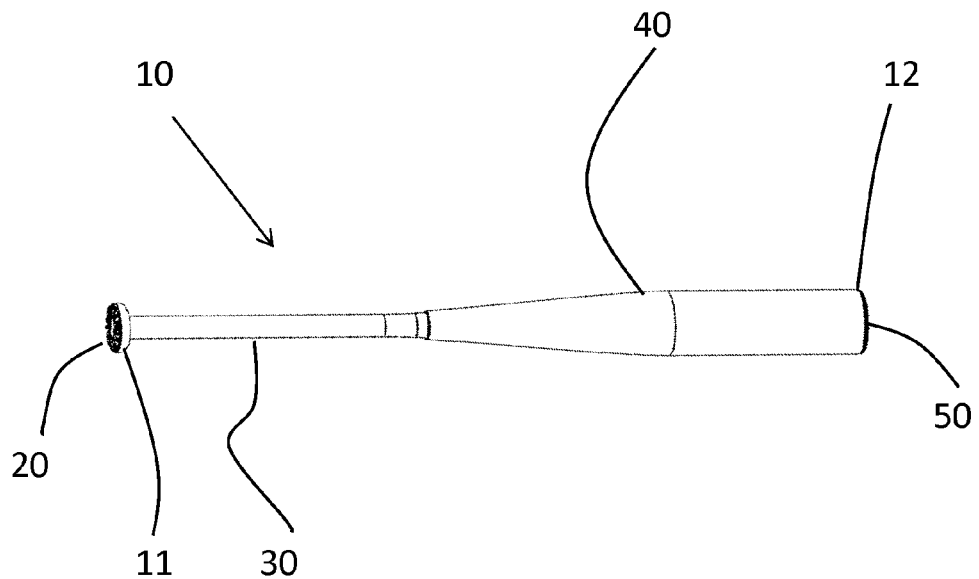
FIG. 1 is a side view of a preferred embodiment of sports equipment.
Figure 2:
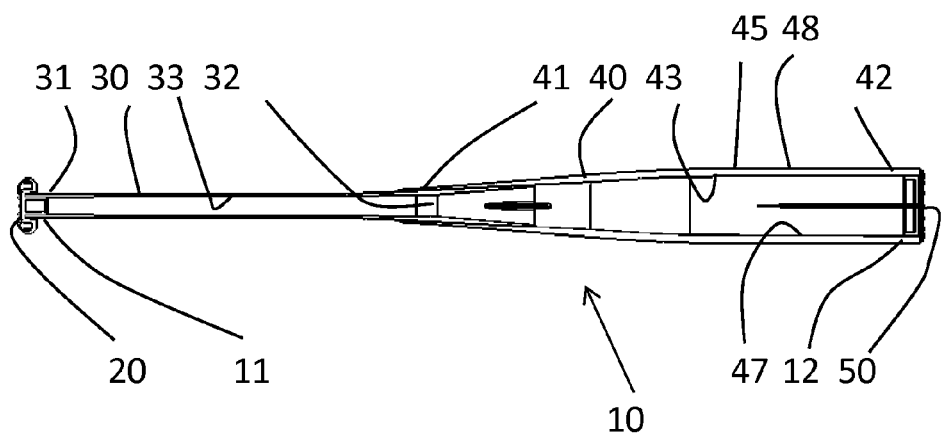
FIG. 2 is a cross-sectional view taken along line 2-2 in FIG. 1.
Figure 3:
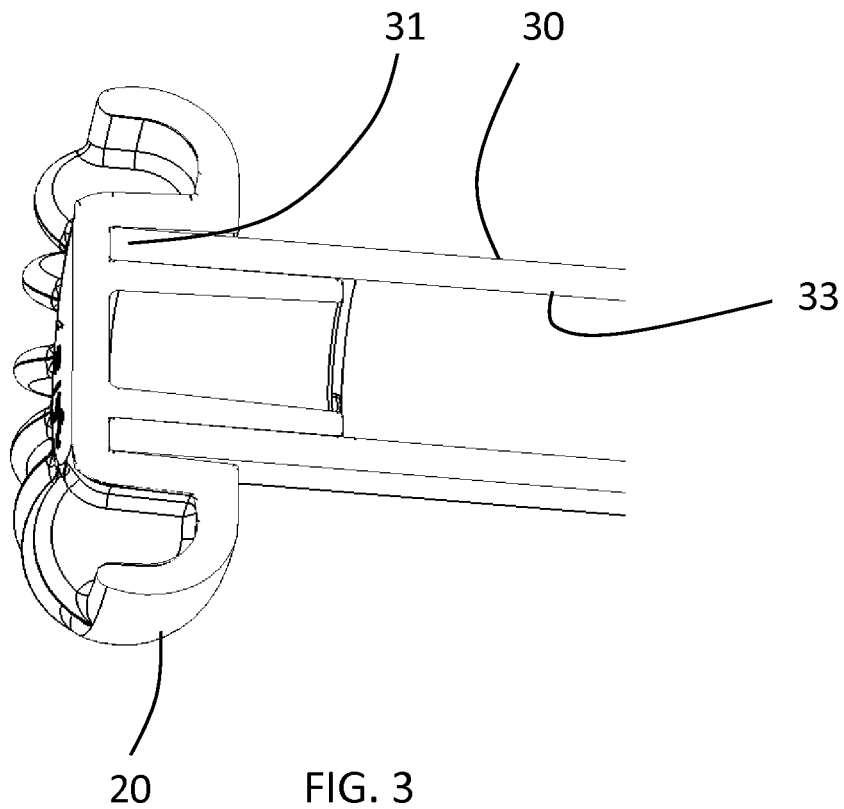
FIG. 3 is a close-up cross-sectional view of one end of a bat.

While the invention will be described in connection with one or more preferred embodiments, it will be understood that it is not intended to limit the invention to those embodiments. On the contrary, it is intended to cover all alternatives, modifications and equivalents as may be included within the spirit and scope of the invention as defined by the appended claims.

Turning now to FIGS. 1-7, it is seen that a first embodiment of sports gear of the present invention is illustrated. It is appreciated that other embodiments, such as but not limited to hockey sticks, cricket bats and tennis racquets may utilize the concepts of the present invention.

A bat 10 is provided having ends 11 and 12. A knob 20 is at the first end and a cap 50 is at the second end. The knob and cap can be transparent, wherein a person can inspect the inside of the bat for tampering.

The bat 10 further has a handle 30. The handle has a handle first end 31 and a handle second end 32. A wall 33 spans between the ends. The wall has a generally circular profile along the handle length. The diameter can vary along its length, specifically increasing in diameter at or near the second end. It is understood that while the maximum diameter is fixed by specifications, that the diameter can be varied to tailor to a desired moment of inertia (MOI), reduction in trampoline effect, etc. One or more channels 34 can be formed in the wall preferably at or near the second handle end 32. It is understood that wall thickness can also be varied to achieve desired handle attributes. Further, it is understood that the handle may also be solid as opposed to tubular, which can change the MOI of the bat.

The bat 10 further has a barrel 40. The barrel has a barrel first end 41 and a barrel second end 42. A wall 43 spans between the ends. The wall 43 has a generally circular profile along the barrel length. The diameter can vary along the barrel length, but specifically preferably increases moving from the first end towards the second end a selected amount before having a preferably generally continuous outer diameter in a hitting section 45 near the second barrel end 42. Yet, it is appreciated that while the maximum diameter can be fixed per specifications, that the diameter can vary to tailor to achieve a desired MOI and reduction of trampoline effect. Ridges 44 are provided at or near the barrel first end 41.

It is also understood that wall thickness can also be varied so that MOI can be changed and frequency response (especially hoop frequency response) can be changed by selectably raising or lowering the material stiffness.

Figure 4:
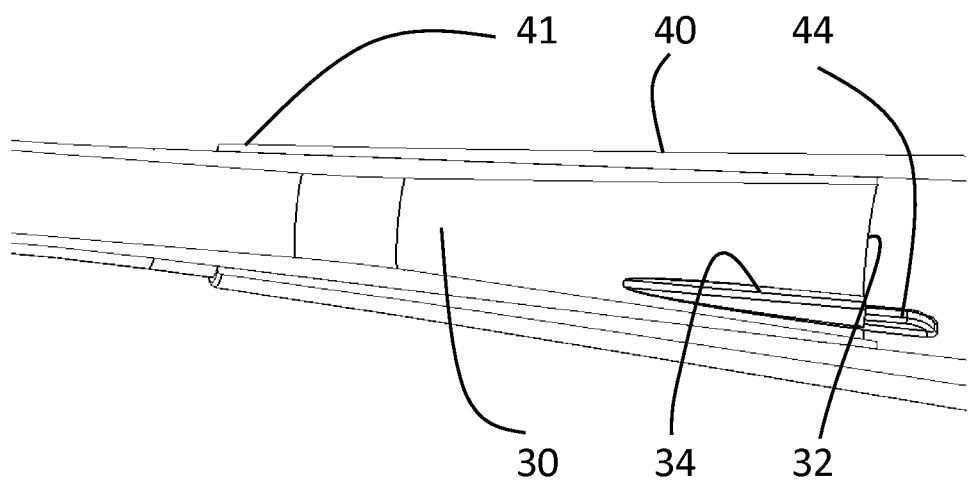
FIG. 4 is a close-up cross-sectional view of a preferred interface between a handle and a barrel.
Figures 5, 6:
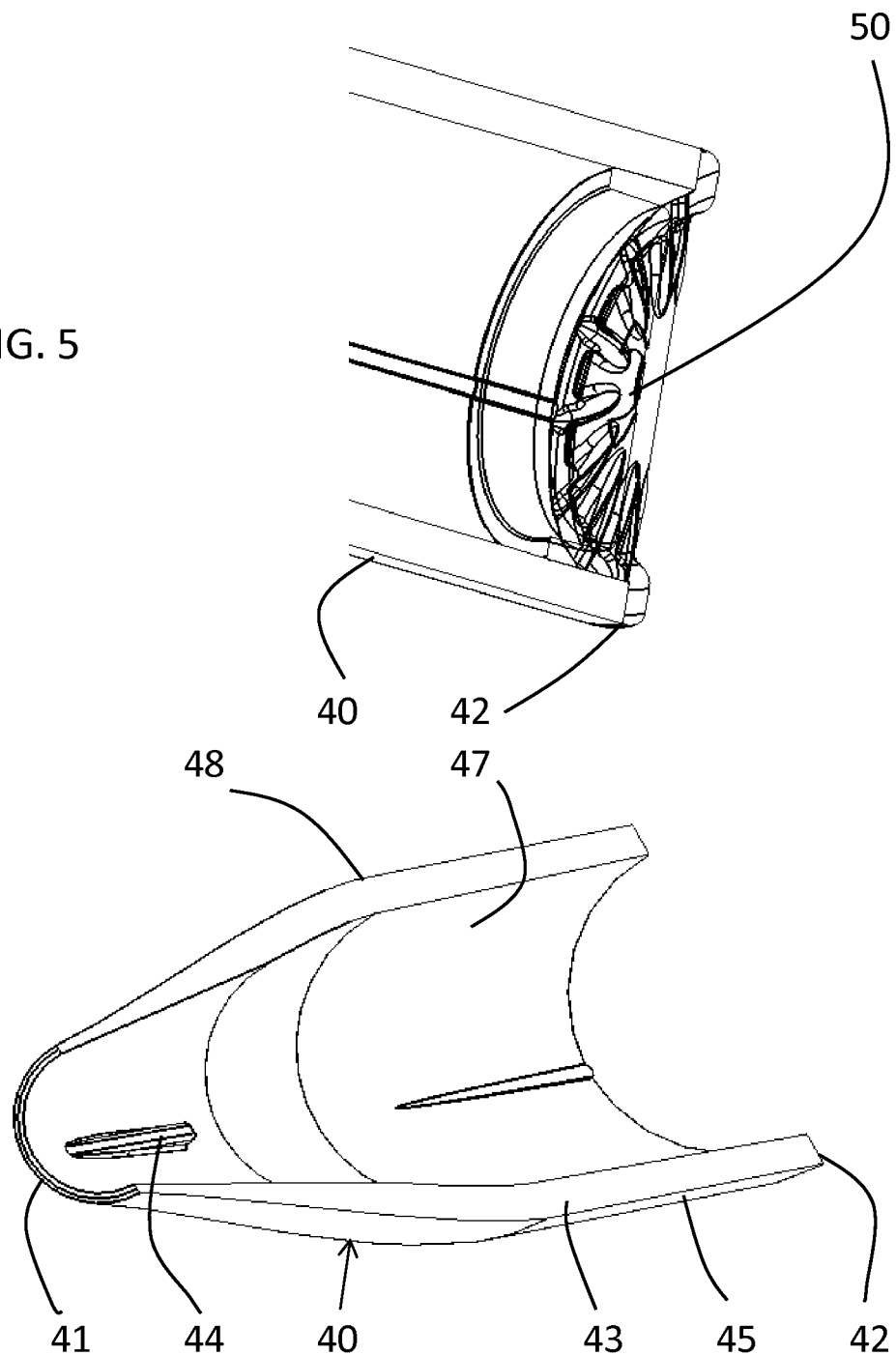
FIG. 5 is a close-up cross-sectional view of a second end of a bat.
FIG. 6 is an isolation cross-sectional view of a barrel.
Figure 7:
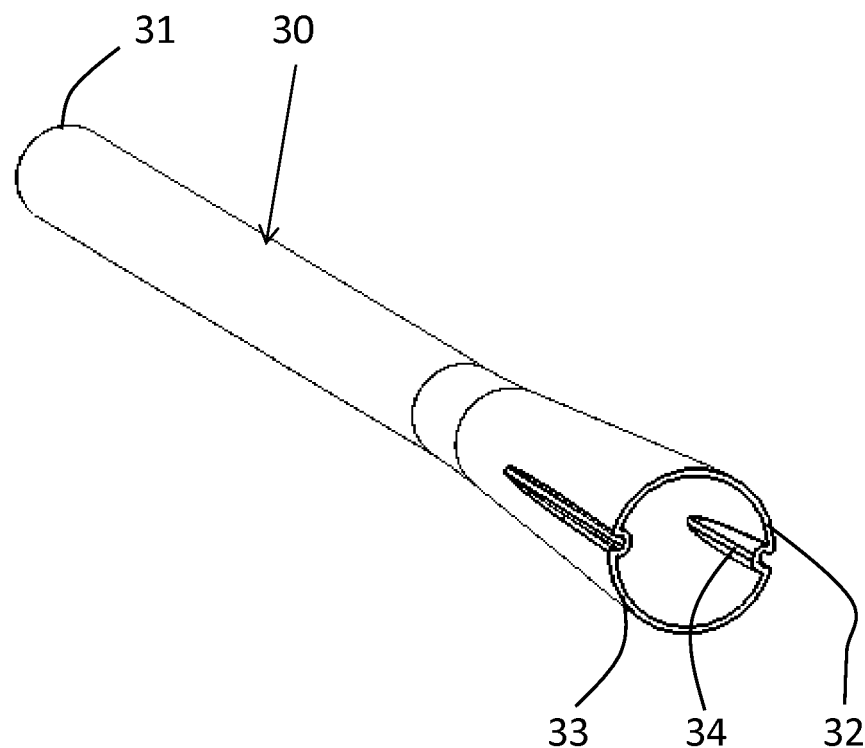
FIG. 7 is an isolation perspective view of a handle.

As seen best in FIG. 4, the channel 34 of the handle and the ridge 44 of the barrel can mate in the assembled bat 10. The ridges 44 and channel 34 form a strong joint between the barrel 40 and handle 30. In this regard, this junction between components avoids increases in weight, and provides stiffness to the barrel and handles sections. Resonant frequencies (both radial and longitudinal) can therefore be tailored as can the dampening effect.

It is appreciated that this fluted relationship between components is also applicable between the barrel and cap, and between the handle and knob.

The cap 50 is connected to the barrel second end 42 and the knob 20 is connected to the handle first end 31. It is appreciated that the cap 50 and knob 20 may be transparent, such that a visual inspection can be made of the interior of the bat while these components remain intact to check for evidence of tampering.

Figure 8:
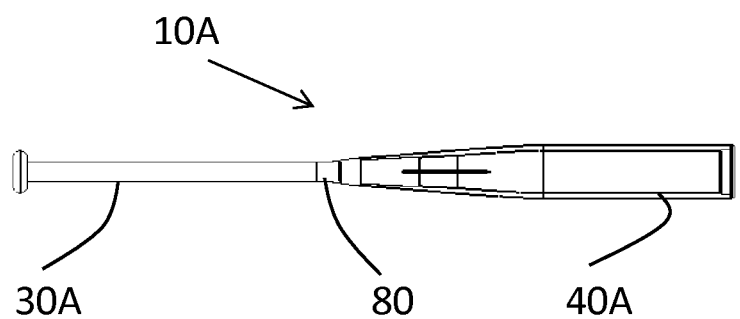
FIG. 8 is a side view of an alternative embodiment of the present invention.
Figures 9, 10:
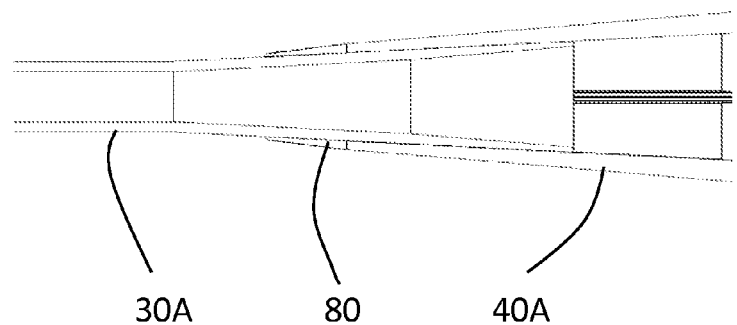
FIG. 9 is a close-up cross-sectional view taken along line 9-9 in FIG. 8.
FIG. 10 is a table summarizing modal characteristics of a C353 profile with a constant wall thickness of 0.25 inches.

Turning now to FIGS. 8 and 9, a second piece of sports equipment is illustrated. It is similar to the embodiment illustrated in FIGS. 1-7, but includes a collar 80 connected to that bat 10A. The collar 80 aids in fixing the handle 30A in relation to the barrel 40A.

A matrix resin can first be selected. While anything thermoplastic and polymeric may be suitable, nylons and TPU (thermoplastic polyurethane) are preferred. The Storage and Loss Modulus of these fiber-filled thermoplastics respond favorably in meeting the BBCOR specification. Storage Modulus is a measure of the energy returned to the ball by the bat during a collision and therefore affects the BBCOR. Similarly, the Loss Modulus reflects the energy lost or dampened during the bat-ball collision and also affects the BBCOR. Barrel fibers are preferably carbon fibers and handle fibers are preferably glass fibers. It is preferred that the fibers comprise between 20% and 70% by weight. In this regard, low fiber content is preferably approximately below 30% by weight. Medium fiber content is preferably approximately 30% to 60% by weight. High fiber content is approximately above 60% by weight.

TPU as described in the present invention can also be of several types. For example, type A can be an ester-based TPU, type B can be an ether-based TPU and type C can be A TPU that is neither ester nor ether based. The final selection takes into account their respective Storage and Loss Moduli.

The fibers are preferably long fibers whose starting lengths are in the pellet for are approximately 15 to 30 mm in length. The fiber length in the molded part is approximately 0.8 to 4 mm given the preferred use of low-shear mixing in injection molding, and with preferred sizing of gates and runners.

An injection molding process is preferably used in the manufacture of the sports equipment. The injection molding process allows the fibers to flow throughout the entire mold in a true 3D structure with a predictable fiber content and orientation. In this regard, mold-filling analytical software is used to tailor fiber orientation which is a function of processing parameters and wall thicknesses and lengths.

The 3D structure is not subject to delamination as are the hand-lay-ups. Hence, there is low probability of a trampoline effect being induced into the bat with use. The bat of the present invention is inherently resistant to an accumulation of cracks, both hidden and visible. In this regard, cracks tend to lead to rapid failure of the bat instead of a softening or trampoline effect, since it exhibits minimal plastic deformation. Further, a bat of the present invention tends to break without yielding or delaminating (both material yielding and delamination increase the trampoline effect).

Figure 12:
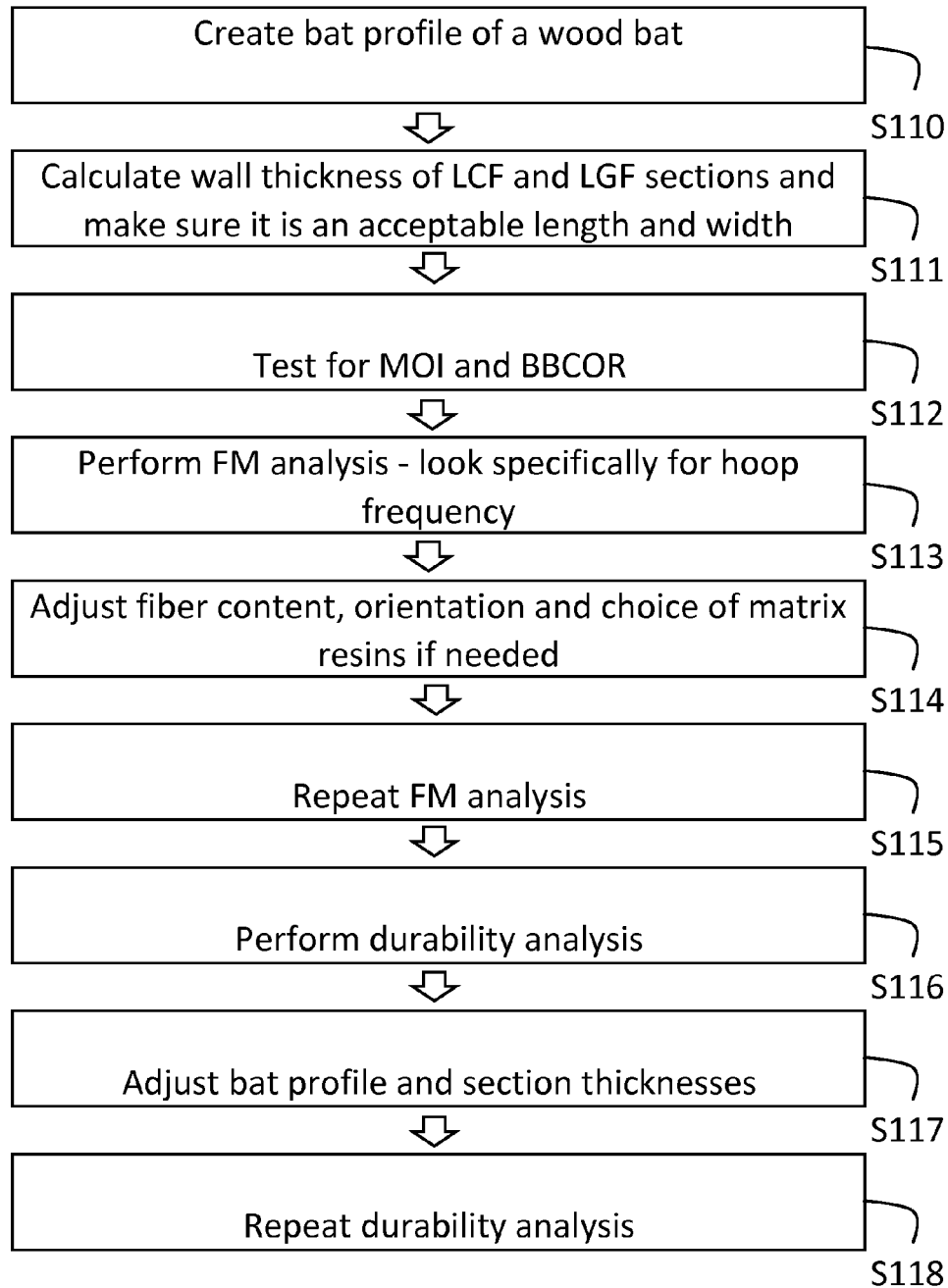
FIG. 12 shows a preferred process of designing barrel.

Turning now to an example, a preferred bat 10 can be designed with the following method. These steps are illustrated in FIG. 12.

Step S110 is to create a bat profile of a traditional wood bat. This was done using the profile of a C353 wood bat scaled to a 2.60 in. barrel outer diameter. Yet, it is understood that any bat profile could be selected based on a spreadsheet analysis of the ensuing MOI, or mass distribution.

Step S111 is to calculate wall thickness of LCF and LGF sections and make sure the bat is an acceptable length and weight. Using the density of each material and the bat geometry, wall thickness was calculated to be approximately 0.25 in. for the three carbon fiber materials (LCF) and 0.21 in. for the glass fiber material (LGF). This would give a 34 in. long bat a mass of approximately 31 oz. with an acceptable moment of inertia (MOI, also called swing weight). The weight range for an NCAA-3 category 34 in. bat is 31.0 oz. to 31.9 oz.

It is appreciated that a similar approach is used for bats of other lengths. An advantage of injection molded bats is that a single molded barrel and handle can be used to make bats of other lengths by sawing off or otherwise removing appropriate lengths of the barrel and handle lengths without sacrificing the bat profile.

Step S111 can be achieved with Finite Element Method Analyses (FEM or FEA). FEM or FEA analyses are conducted to understand the behavior of the material under impact, such as the ball hit, which is accompanied with high, deformation or strain rates. The results of a computer simulation are matched to those of an actual experiment wherein the material is tested for rapid, multiaxial impact, in the ASTM D3763, ISO 6603, 7765 Dynatup tests, for example. The computer model is fine-tuned where necessary to match experimental results. Once the computer model is verified, bat profiles, including wall thicknesses can be varied ad infinitum to test the validity of various design features.

Step S112 is to test for MOI and BBCOR.

Step S113 is to perform frequency modal (FM) analysis. This analysis preferably looks at hoop frequencies in the analysis. A model of a bat is illustrated in FIG. 10. The natural frequencies of the first bending mode and the first hoop mode can be examined and are summarized in FIG. 10. The first bending modes give an estimate of the flexibility along the length of the bat. The typical natural frequency of the first bending mode of currently available bats is between 80 and 220 Hz. The natural frequency of the hoop mode provides information about the batted-ball performance of the bat. To comply with the BBCOR performance criterion, a target hoop frequency would be approximately 3000 Hz. If the hoop frequency is too low, the bat will perform above the BBCOR limit. For simplicity, all models were initially run with a constant wall thickness of 0.25 inches.

It has been found that frequencies about approximately 2000 Hz and higher have yielded acceptable results. The frequency of the barrel is preferably analyzed. Also, the use of a different material for the handle (aluminum for example) does not have a significant impact of the hoop frequency of the barrel. Other parameters are also tailorable (weight and length, responsiveness, etc.).

Step S114 involves adjusting fiber content, orientation and choice of matrix resins if needed based on prior analysis.

Step S115 is to repeat the frequency modal (FM) analysis taking into account adjustments made in step S114.

Step S116 is to perform a durability analysis. FIG. 11 is a table showing minimum wall thicknesses to withstand a 166 mile per hour impact of a bat and a ball. While a 166 mph impact is larger than the speed used for certification, it was nevertheless used as a preferred speed because it is representative of the high-speed impact that could be found in a game. In this figure, the round objects at the handle of the bat are rubber rollers used to hold the bat in place. The stiffness of the rollers is comparable to a player's grip. The rollers are mounted on a steel plate that is free to rotate upon impact.

Step S117 is to adjust bat profile and section thicknesses in response to the durability analysis if needed. A table summarizing minimum wall thickness to withstand 166-mph impact is shown in FIG. 11.

Step S118 is to repeat the durability analysis.

Figure 13:
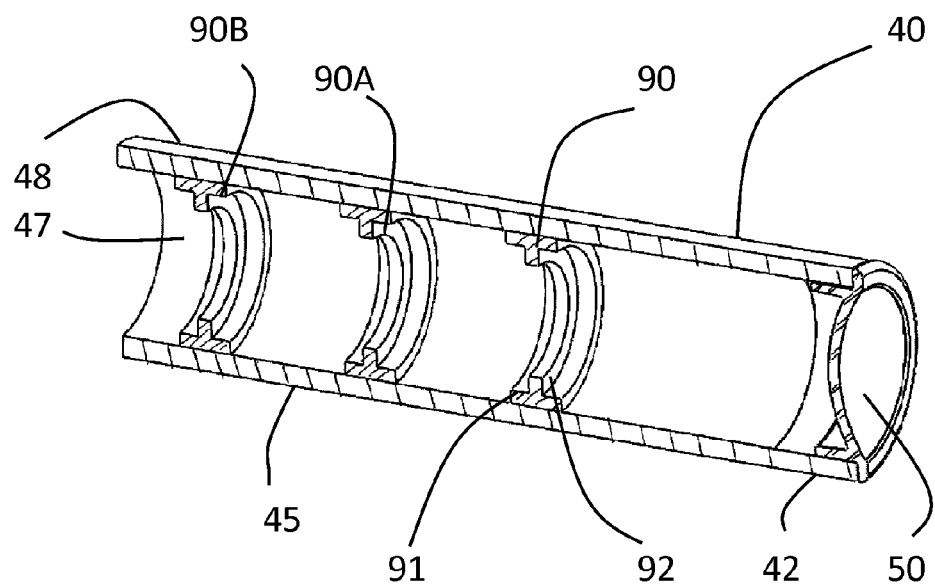
FIG. 13 is a cross-sectional view showing three rings on the inside of the barrel.
Figure 14:
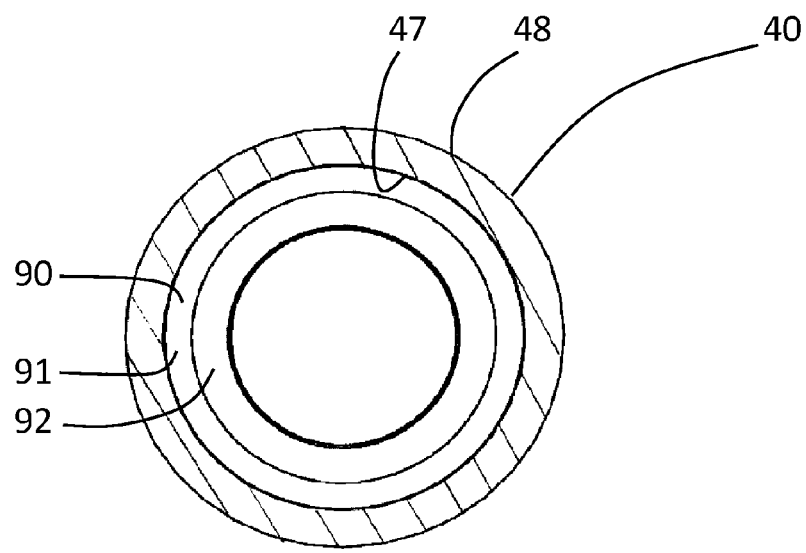
FIG. 14 is a cross-sectional view showing a ring encircling the inside of the barrel.

Turning now to FIGS. 13 and 14, it is seen that a ring 90 having a base 91 and a beam 92 is provided. The base 91 can be selectably positioned along the length of the barrel 40 on the inside of the barrel. The base 91 can be fixed to the wall 43. A second and third ring, 90A and 90B, respectively, can also be provided. While three rings are shown, it is appreciated that more or fewer may be used without departing from the broad aspects of the present invention.

The beam 92 is preferably oriented generally perpendicular to the base 91, wherein a generally T-shaped profile is created. The number and the location of the rings allow the user to adjust and select the rigidity of the barrel. In this regard, selecting the rigidity of the barrel allows the user to tailor the sweet spot, the BBCOR ratio and the swing weight of the bat to suit the user's (i.e. batter's) specifications.

Thus it is apparent that there has been provided, in accordance with the invention, sports gear that fully satisfies the objects, aims and advantages as set forth above. While the invention has been described in conjunction with specific embodiments thereof, it is evident that many alternatives, modifications, and variations will be apparent to those skilled in the art in light of the foregoing description. Accordingly, it is intended to embrace all such alternatives, modifications, and variations as fall within the spirit and broad scope of the appended claims.

We claim:

1. A bat comprising:
   a handle having a handle wall, said handle wall having a channel, said handle having a handle interior and said channel being formed inwards towards said handle interior along a bat longitudinal axis; and
   a barrel having a barrel wall, said barrel wall having a ridge, said barrel having a barrel interior and said ridge being formed inwards towards said barrel interior along said longitudinal bat axis,
   wherein:
   said ridge is received within said channel when said handle is joined to said barrel,
   said barrel has fibers in said barrel and said fibers in said barrel comprise between 20% and 70% fibers by weight, and
   said barrel has a continuous exterior surface whereby said fibers in said barrel are uninterrupted at said continuous exterior surface and wherein said bat has a ring, said ring being on said barrel interior and wherein said bat has a hitting section with a constant inner diameter; and said ring is selectably located within said hitting section.

2. The bat of claim 1 wherein said bat comprises a plurality of rings.

3. The bat of claim 1 wherein said ring comprises a base that encircles said barrel interior and a beam inwardly projecting from said base, said beam and said base having a generally T-shaped profile.

4. The bat of claim 1 wherein said barrel has a length, the length of said barrel being cut to a specific length after said barrel is formed in an injection molded process.

5. The bat of claim 1 wherein said barrel is comprised of long fiber thermoplastic having fibers, wherein said fibers are arranged in a three-dimensional arrangement within said barrel.

6. The bat of claim 1 wherein said barrel has a hoop frequency that is approximately 3000 Hz.

7. A method of making the bat of claim 1, the bat having profile sections and the method comprising the steps of:
   create a profile of an existing piece of equipment;
   calculate wall thickness of a composite material having a fiber content, orientation and resin, and determine if it yields an acceptable weight, length and width;
   test MOI and BBCOR;
   perform FM analysis;
   perform durability analysis; and
   adjust said profile sections of the bat.

8. The method of claim 7 wherein the step of perform FM analysis includes the step of looking at a hoop frequency, wherein a material stiffness can be adjusted by adjusting wall thickness if said hoop frequency is unacceptable.

9. The method of claim 7 wherein between the steps of perform FM analysis and perform durability analysis, the method comprises the step of adjusting the fiber content, orientation and choice of resin.

10. The method of claim 7 further comprising the steps of adjusting the profile sections and section thickness and repeating the step of perform a durability analysis.

11. The method of claim 7 wherein the step of calculating a wall thickness is based on a material with between 20% and 70% fibers, between 0.8 and 4 mm fibers when injected, whereby the bat is a three-dimensional structure not subject to delamination.

* * * * *